United States Patent
Foong et al.

(10) Patent No.: US 11,798,871 B2
(45) Date of Patent: Oct. 24, 2023

(54) DEVICE PACKAGE SUBSTRATE STRUCTURE AND METHOD THEREFOR

(71) Applicant: NXP USA, INC., Austin, TX (US)

(72) Inventors: Chee Seng Foong, Austin, TX (US); Trent Uehling, New Braunfels, TX (US); Tingdong Zhou, Austin, TX (US)

(73) Assignee: NXP USA, INC., Austin, TX (US)

( * ) Notice: Subject to any disclaimer, the term of this patent is extended or adjusted under 35 U.S.C. 154(b) by 291 days.

(21) Appl. No.: 16/999,489

(22) Filed: Aug. 21, 2020

(65) Prior Publication Data
US 2022/0059441 A1 Feb. 24, 2022

(51) Int. Cl.
*H01L 23/495* (2006.01)
*H01L 23/498* (2006.01)
*H01L 21/48* (2006.01)

(52) U.S. Cl.
CPC .... *H01L 23/49822* (2013.01); *H01L 21/4857* (2013.01); *H01L 23/49866* (2013.01)

(58) Field of Classification Search
CPC ........... H01L 23/49822; H01L 21/4857; H01L 23/49866; H01L 23/145; H01L 21/486; H01L 23/49816
USPC ...................................................... 257/668
See application file for complete search history.

(56) References Cited

U.S. PATENT DOCUMENTS

| | | | |
|---|---|---|---|
| 7,589,398 B1 | 9/2009 | Huemoeller et al. | |
| 7,906,371 B2 | 3/2011 | Kim et al. | |
| 8,127,979 B1 | 3/2012 | Wu et al. | |
| 8,322,032 B2 | 12/2012 | Lee | |
| 9,565,774 B2 | 2/2017 | Lee | |
| 9,972,589 B1 * | 5/2018 | Goh ...................... | H01L 23/528 |
| 2007/0231951 A1 | 10/2007 | Suryakumar | |
| 2018/0350630 A1 | 12/2018 | Kang et al. | |
| 2020/0013706 A1 | 1/2020 | Kang et al. | |

OTHER PUBLICATIONS

Nishio, T., "3D Package Technologies Review with Gap Analysis for Mobile Application Requirements", STATSChipPAC Japan, Apr. 22, 2014.
Tsai, J., "Innovative Embedded Technologies to Enable Thinner IoT/Wearabie/Mobile Devices", Semicon Taiwan, Sep. 2-4, 2015.

* cited by examiner

*Primary Examiner* — Theresa T Doan

(57) ABSTRACT

A semiconductor device substrate is provided. The substrate includes an embedded trace substrate (ETS) portion. The ETS portion includes a first conductive layer embedded in the ETS portion at a first major surface. A portion of the first conductive layer is patterned to form a signal line. A non-conductive layer is disposed between the first conductive layer and a second conductive layer second embedded in the ETS portion. A third conductive layer is formed over the first major surface of the ETS portion. The third conductive layer is configured to form a stripline with the signal line of the first conductive layer.

19 Claims, 9 Drawing Sheets

DEVICE PACKAGE SUBSTRATE STRUCTURE AND METHOD THEREFOR

BACKGROUND

Field

This disclosure relates generally to semiconductor device packaging, and more specifically, to a device package substrate structure and method of forming the same.

Related Art

Today, there is an increasing trend for system-on-chip (SoC) devices to incorporate circuitry requiring very high transmission speeds for applications such as vehicular radar systems, MiPi controllers, PCIe and DDR memory controllers. However, features accommodating such high transmission speeds can have a significant impact to printed circuit board area and system costs. Therefore, a need exists for such SoC devices to minimize printed circuit board area and system cost impact while providing features which utilize very high transmission speeds.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a device substrate configured to form a stripline. The device substrate structure includes a conductive layer formed over a major surface of a coreless embedded trace substrate (ETS). The conductive layer is configured to serve as a ground plane for an embedded signal line at the major surface of the ETS to form the stripline. By forming the device substrate in this manner, a compact footprint is maintained while providing a capability for the stripline formed with the embedded signal line to carry radio frequency (RF) signals having a frequency in a range of 50 GHz and higher, for example.

Figure 1:
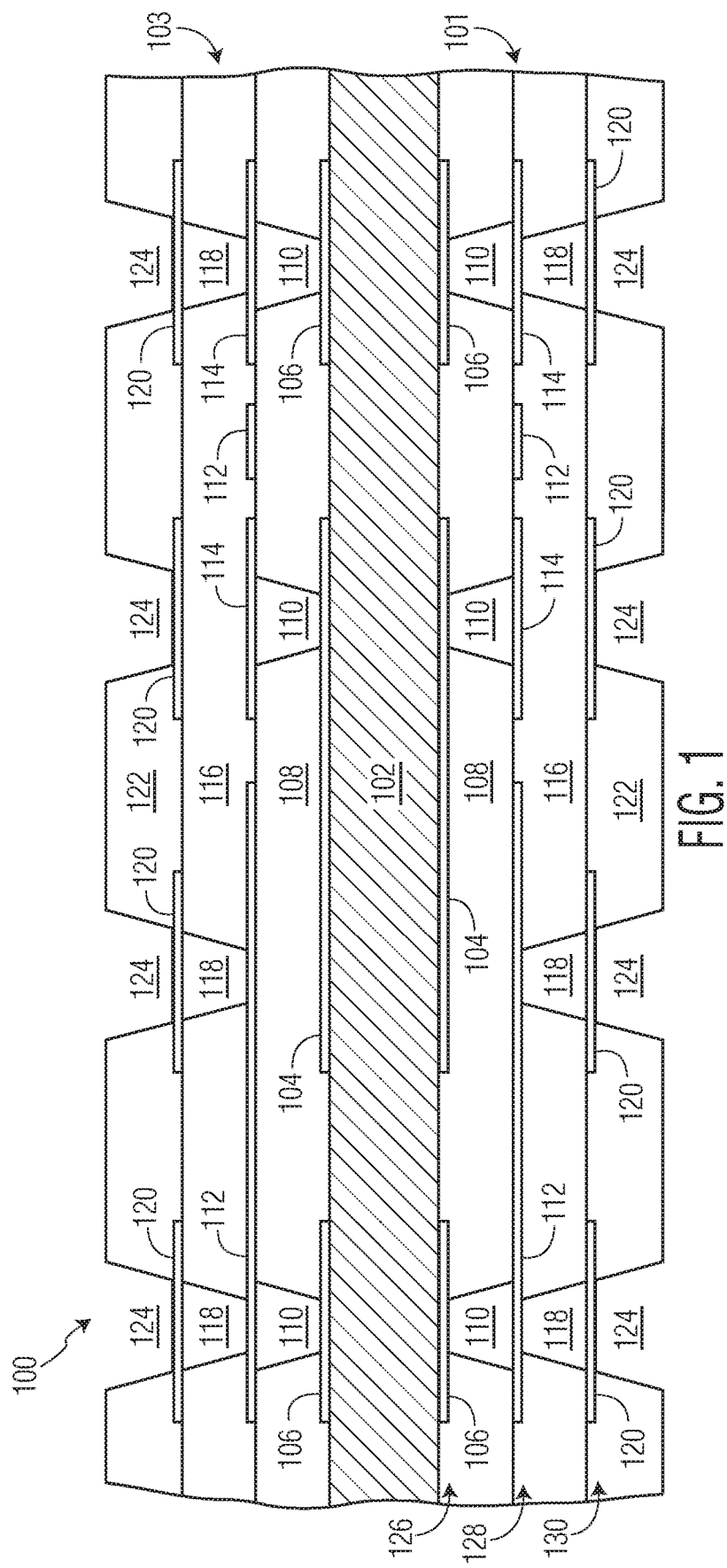
FIG. 1 and FIG. 2 illustrate, in simplified cross-sectional views, an example embedded trace substrate (ETS) at stages of manufacture in accordance with an embodiment.

FIG. 1 illustrates, in a simplified cross-sectional view, an example ETS 100 at a stage of manufacture in accordance with an embodiment. At this stage of manufacture, the ETS 100 includes a first ETS portion 101 and a second ETS portion 103 formed on a core carrier 102. In this embodiment, each of the first ETS portion 101 and the second ETS portion 103 are formed similar to one another on opposite major surfaces of the core carrier 102 in a buildup manner. Because in this embodiment, the first ETS portion 101 and the second ETS portion 103 are formed similar to one another, only the first ETS portion 101 will be described in more detail.

The first ETS portion 101 is formed as a multilayer laminate structure. For example, the first ETS portion 101 includes conductive layers 126, 128, and 130 (e.g., metal or other conductive material layers) separated by non-conductive layers 108 and 116 (e.g., glass filled epoxy, polyimide, FR-4, ceramic). In this embodiment, each of the conductive layers 126, 128, and 130 and interconnecting contacts 110 and 118 are formed from a copper material. The first ETS portion 101 as depicted includes three conductive layers (e.g., layers 126, 128, and 130). In some embodiments, the first ETS portion 101 may be formed with two conductive layers or more than three conductive layers.

The first conductive layer 126 located adjacent to the core carrier 102 is patterned and etched to form conductive traces 104 and 106. In this embodiment, conductive trace 104 may be characterized as a signal line configured for carrying a signal. A first non-conductive layer 108 is formed over the patterned and etched first conductive layer embedding conductive traces 104 and 106. The first non-conductive layer 108 is patterned and etched or laser drilled to form contact openings exposing portions of conductive traces 104 and 106. Contacts 110 formed from a conductive material fill the contact openings and provide a conductive interconnect to the exposed portions of conductive traces 104 and 106.

A second conductive layer 128 is formed on the exposed portions of the first non-conductive layer 108 and contacts 110. The second conductive layer is patterned and etched to form conductive traces 112 and 114. In this embodiment, conductive trace 112 may be characterized as a ground plane configured for connection to a ground supply terminal. A second non-conductive layer 116 is formed over the patterned and etched second conductive layer embedding conductive traces 112 and 114. The second non-conductive layer 116 is patterned and etched or laser drilled to form contact openings exposing portions of conductive traces 112 and 114. Contacts 118 formed from a conductive material fill the contact openings and provide a conductive interconnect to the exposed portions of conductive traces 112 and 114.

A third conductive layer 130 is formed on the exposed portions of the second non-conductive layer 116 and contacts 118. The third conductive layer is patterned and etched to form conductive traces 120. A third non-conductive layer 122 (e.g., solder mask layer) is formed over the patterned and etched third conductive layer embedding conductive traces 120. The third non-conductive layer 122 is patterned and etched or laser drilled to form pad openings 124 exposing portions of conductive traces 120. In this embodiment, exposed portions of conductive traces 120 may be characterized as connector pads configured for connection to a printed circuit board (PCB) by way of conductive solder balls, for example.

Figure 2:
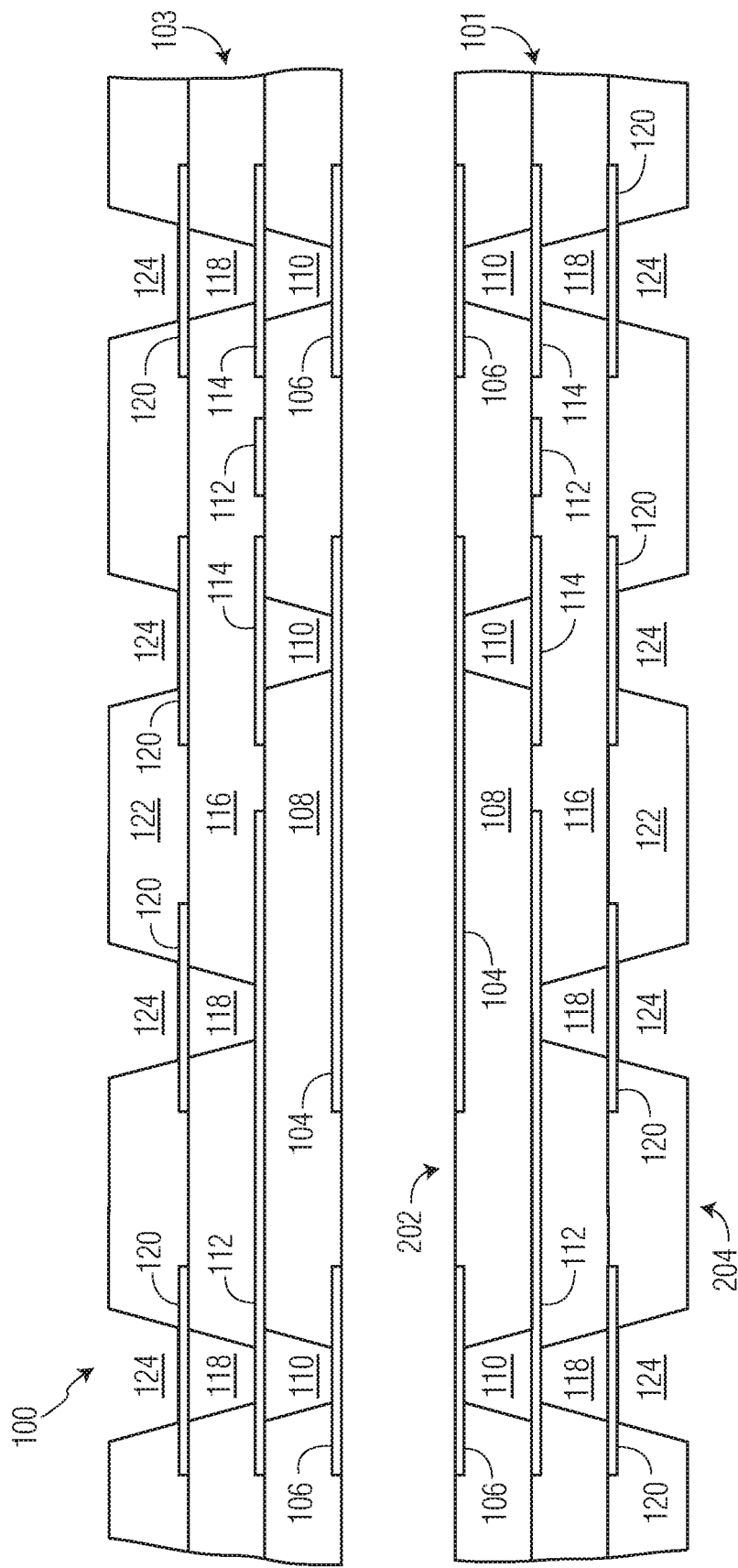

FIG. 2 illustrates, in a simplified cross-sectional view, the example ETS 100 at a subsequent stage of manufacture in accordance with an embodiment. At this stage of manufacture, the first ETS portion 101 and the second ETS portion 103 are separated from the core carrier 102. In this embodiment, the ETS portion 101 includes a first major surface 202 and a second major surface 204. The ETS portion 101 is included in further stages of manufacture of the device substrate 300 depicted in FIG. 3 through FIG. 9.

FIG. 3 through FIG. 8 illustrate, in simplified cross-sectional views, an example device package substrate structure 300 at stages of manufacture in accordance with an embodiment.

Figure 3:
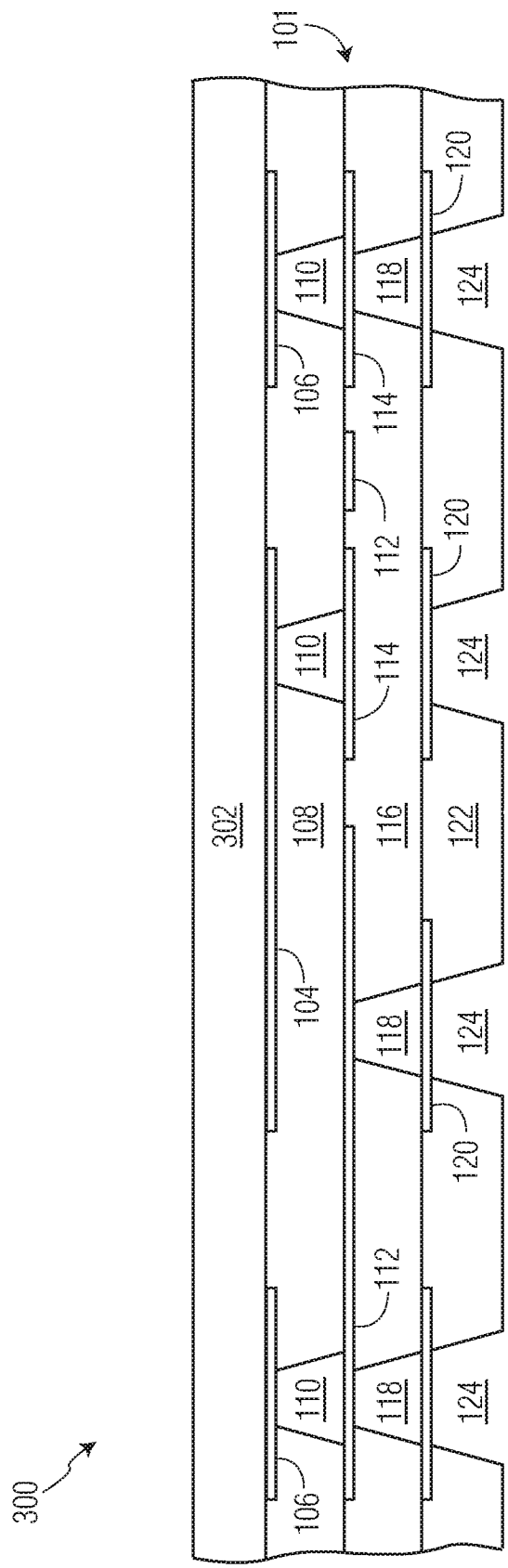
FIG. 3 through FIG. 8 illustrate, in simplified cross-sectional views, an example device package substrate structure at stages of manufacture in accordance with an embodiment.

FIG. 3 illustrates, in a simplified cross-sectional view, the example device substrate 300 at a stage of manufacture in accordance with an embodiment. At this stage of manufacture, the device substrate 300 includes a first dielectric layer 302 formed on the first major surface 202 of the ETS portion 101. In this embodiment, the first dielectric layer 302 may be characterized as an inter-level dielectric (ILD) layer formed from a deposited layer such as glass filled epoxy, polyimide, or the like.

Figure 4:
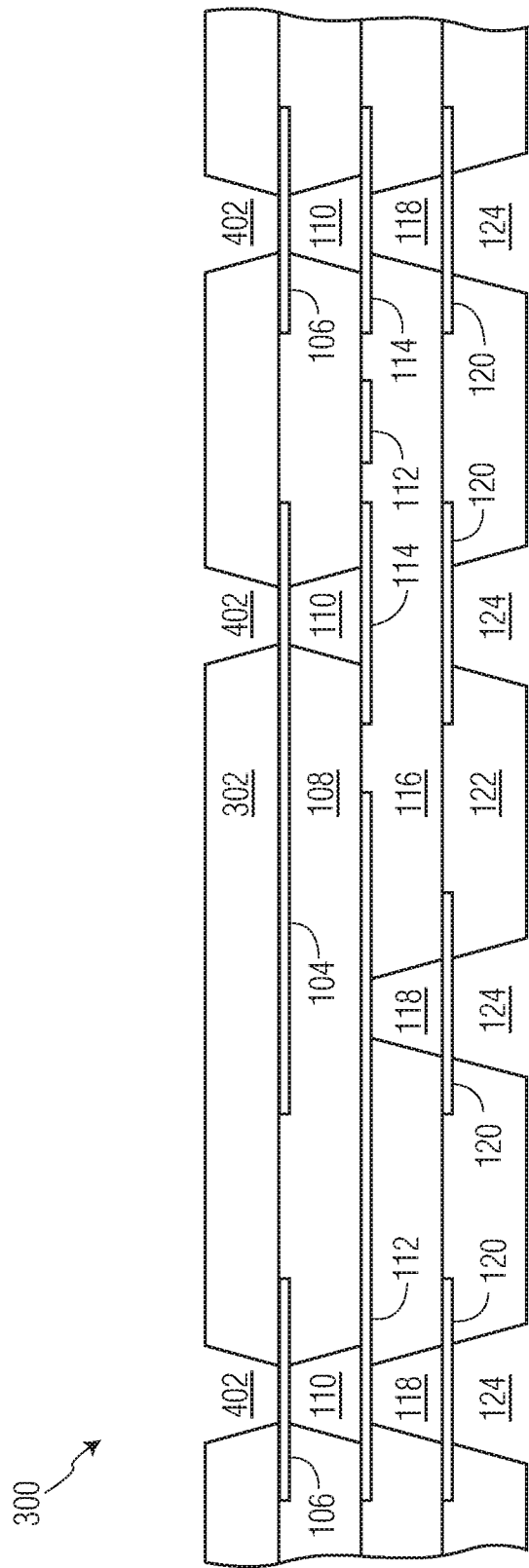

FIG. 4 illustrates, in a simplified cross-sectional view, the example device substrate 300 at a subsequent stage of manufacture in accordance with an embodiment. At this stage of manufacture, the device substrate 300 includes contact openings 402 formed in the first dielectric layer 302. In this embodiment, the first dielectric layer 302 is patterned and etched to form contact openings 402. Each of contact openings 402 is configured to expose a portion of embedded traces 104 and 106, for example.

Figure 5:
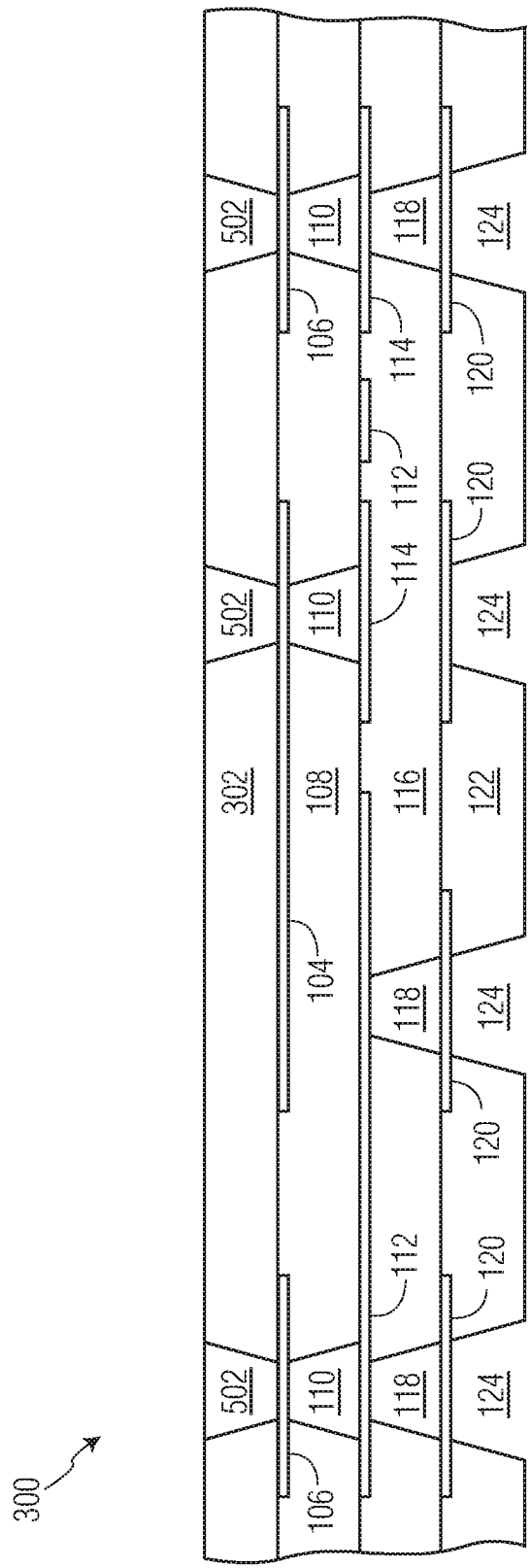

FIG. 5 illustrates, in a simplified cross-sectional view, the example device substrate 300 at a subsequent stage of manufacture in accordance with an embodiment. At this stage of manufacture, the device substrate 300 includes conductive contacts 502 formed in the first dielectric layer 302. The contact openings (402) in the first dielectric layer 302 are filled with a conductive material (e.g., metal material) to provide a conductive interconnect to the exposed portions of conductive traces 104 and 106. In this embodiment, a plating process may be utilized to fill the contact openings with a copper material, for example.

Figure 6:
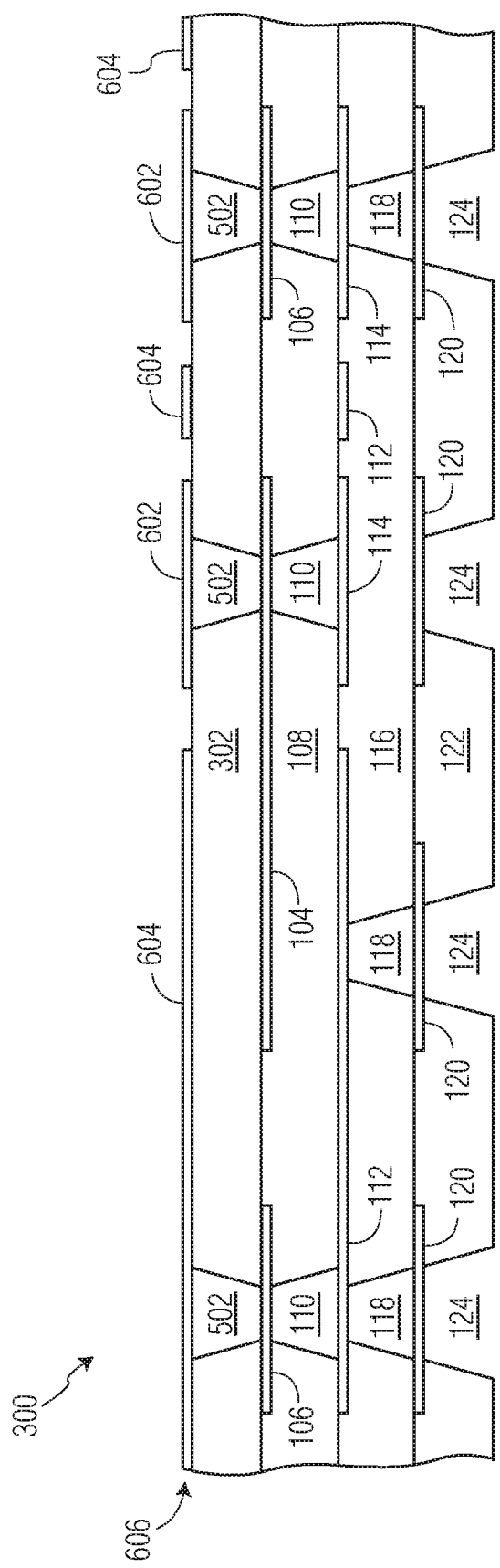

FIG. 6 illustrates, in a simplified cross-sectional view, the example device substrate 300 at a subsequent stage of manufacture in accordance with an embodiment. At this stage of manufacture, the device substrate 300 includes conductive traces 602 and 604 formed on the exposed portions of the first dielectric layer 302 and contacts 502. In this embodiment, a conductive layer 606 (e.g., copper metal layer) is formed on the exposed portions of the first dielectric layer 302 and contacts 502. The conductive layer 606 is patterned and etched to form conductive traces 602 and 604 thereby interconnecting, by way of contacts 502, conductive traces 104 and 106 with respective conductive traces 602 and 604. In this embodiment, conductive trace 604 may be characterized as a ground plane configured for connection to a ground supply terminal. In this embodiment, the embedded signal line 104 is configured to form a stripline when located between a ground plane formed with embedded trace 112 and a ground plane formed with conductive trace 604. Accordingly, the stripline may be characterized as a high frequency transmission line configured for carrying RF signals having a frequency in a range of 50 GHz and higher, for example.

Figure 7:
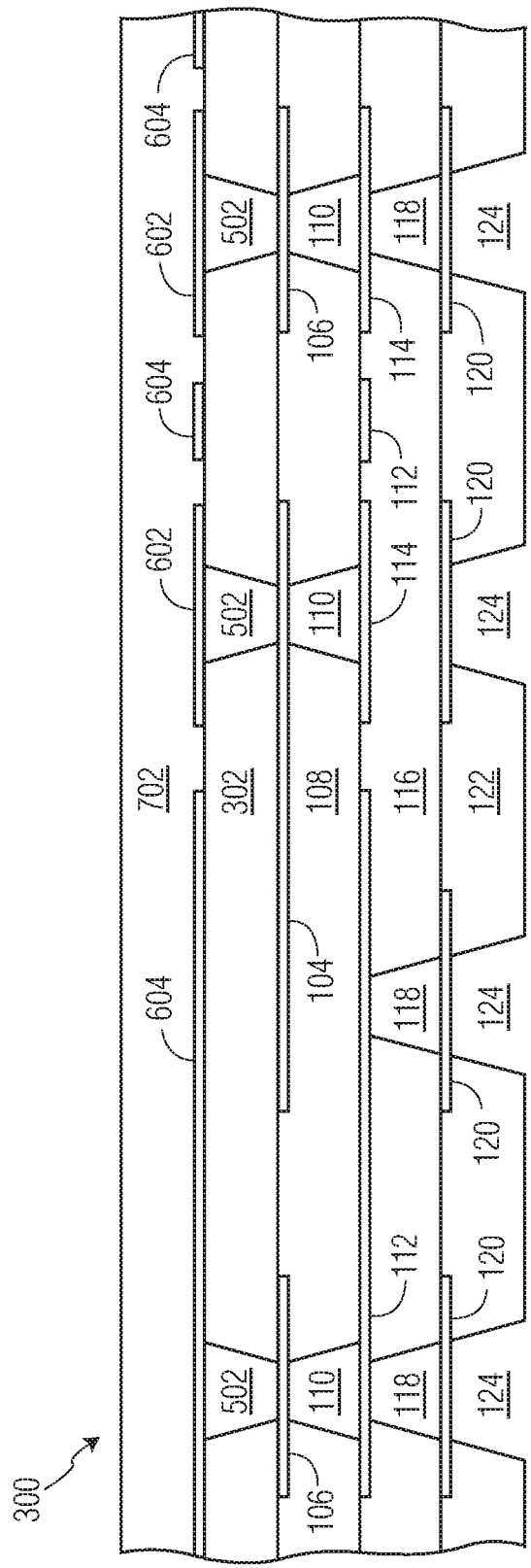

FIG. 7 illustrates, in a simplified cross-sectional view, the example device substrate 300 at a subsequent stage of manufacture in accordance with an embodiment. At this stage of manufacture, the device substrate 300 includes a second dielectric layer 702 formed on the conductive traces 602 and 604 and exposed portions of the first dielectric layer 302. In this embodiment, the dielectric layer 702 may be characterized as passivation layer formed from a deposited layer such as glass filled epoxy, polyimide, or the like.

Figure 8:
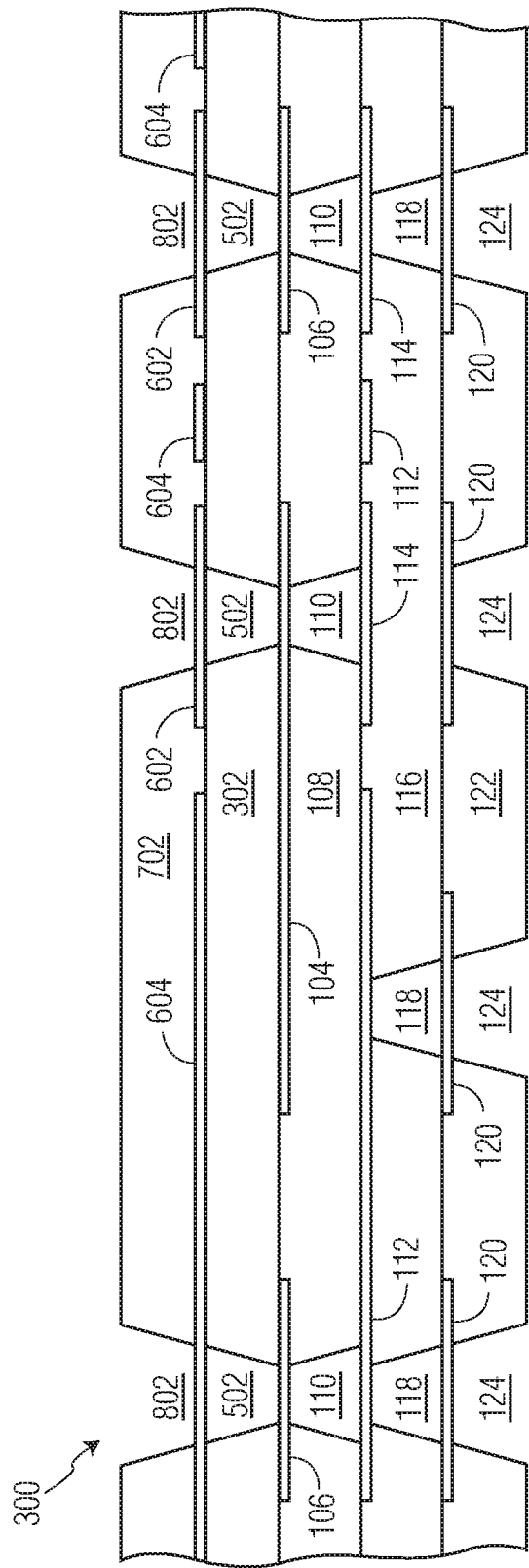

FIG. 8 illustrates, in a simplified cross-sectional view, the example device substrate 300 at a subsequent stage of manufacture in accordance with an embodiment. At this stage of manufacture, the device substrate 300 includes pad openings 802 formed in the dielectric layers 702. In this embodiment, the dielectric layer 702 is patterned and etched to form pad openings 802 configured to expose a portion of embedded traces 602 and 604. For example, by forming the pad openings 802, conductive connections (e.g., by way of conductive pillars) can be formed between a semiconductor die and the exposed portions of embedded traces 602 and 604.

Figure 9:
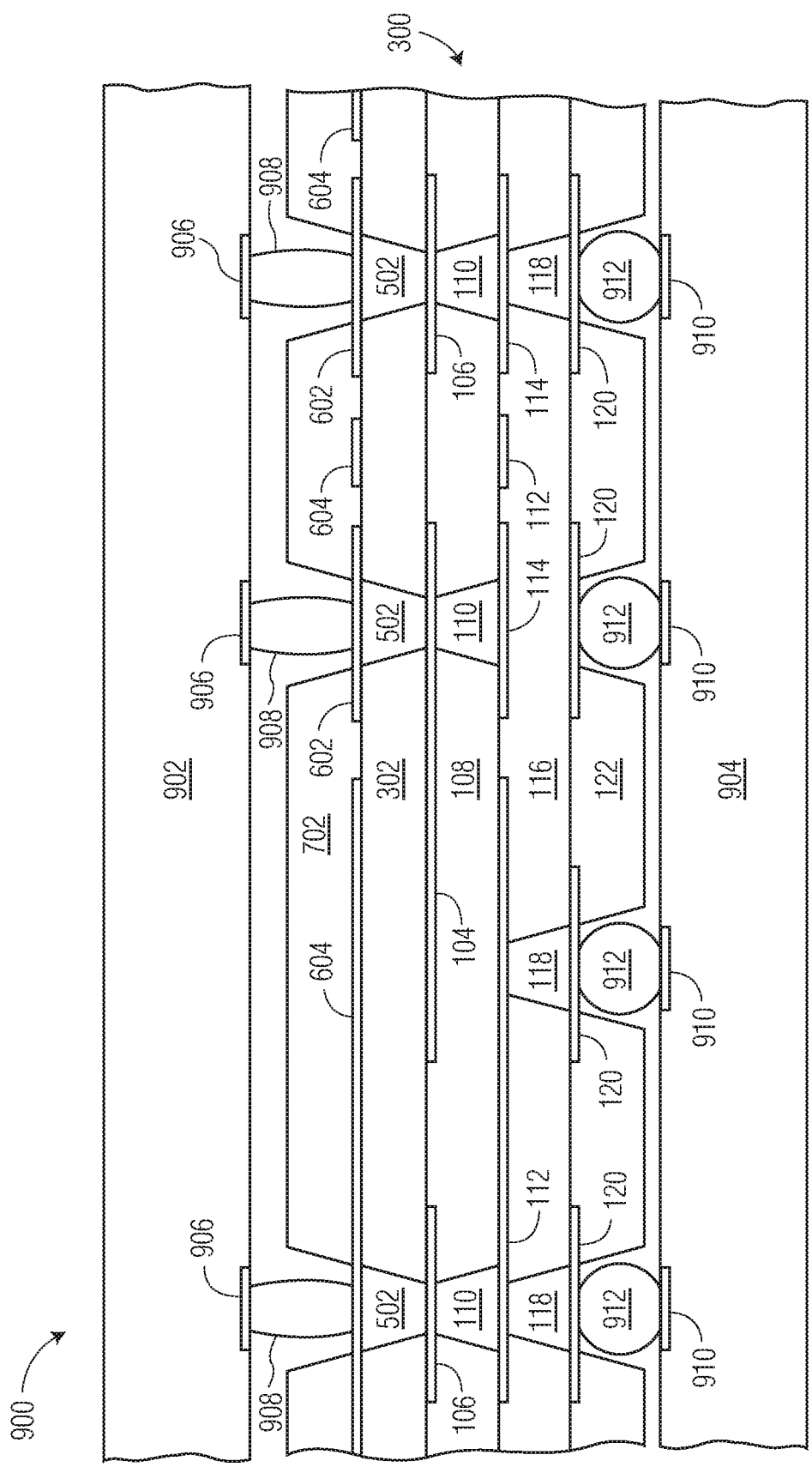
FIG. 9 illustrates, in a simplified cross-sectional view, an example semiconductor device at a stage of manufacture in accordance with an embodiment.

FIG. 9 illustrates, in a simplified cross-sectional view, an example semiconductor device 900 at a stage of manufacture in accordance with an embodiment. At this stage of manufacture, semiconductor device 900 includes the device substrate 300 (e.g., depicted in FIG. 8) configured with a semiconductor die 902 and mounted on a PCB 904. In this embodiment, conductive pillars 908 are employed to connect the semiconductor die 902 to conductive features (e.g., traces 602 and 604) at a first surface of the device substrate 300, and conductive balls connectors 912 are employed to connect conductive features (e.g., traces 120) at a second surface of the device substrate 300 to the PCB 904.

The semiconductor die 902 has an active surface (e.g., major surface having circuitry) and a backside surface (e.g., major surface opposite of the active surface). The semiconductor die 902 includes bond pads 906 at the active surface configured for connection to the device substrate 300, for example. The semiconductor die 902 may be formed from any suitable semiconductor material, such as silicon, germanium, gallium arsenide, gallium nitride and the like. Semiconductor die 902 may further include any digital circuits, analog circuits, RF circuits, memory, signal processor, MEMS, sensors, the like, and combinations thereof.

In this embodiment, the semiconductor die 902 is configured in a flip chip orientation and connected to the device substrate 300 by way of the conductive pillars 908 (e.g., copper pillars, nanotubes, solder bumps). In some embodiments, a reflowable material (e.g., solder) may cover at least a portion of the conductive pillars 908 to facilitate electrical connection to the device substrate 300. The conductive pillars 908 are configured to provide a conductive connection between bond pad 906 and traces 602 and 604.

In this embodiment, the device substrate 300 is mounted on the PCB 904 by way of the conductive ball connectors 912 (e.g., solder balls). The conductive ball connectors 912 are affixed using known techniques and materials. The conductive ball connectors 912 are configured to provide a conductive connection between PCB pads 910 and traces 120. Alternatively, conductive ball connectors 912 may be any suitable conductive structure such as gold studs, copper pillars, pogo pins, land grid array contacts, and the like, to electrically connect conductive traces 120 of device substrate 300 with the PCB 904, for example.

Generally, there is provided, a semiconductor device substrate including an embedded trace substrate (ETS) portion having a first major surface and a second major surface, the ETS portion including a first conductive layer embedded in the ETS portion at the first major surface, a portion of the first conductive layer patterned to form a signal line; a second conductive layer embedded in the ETS portion; a first non-conductive layer disposed between the first conductive layer and the second conductive layer; and a third conductive layer formed over the first major surface of the ETS portion, the third conductive layer configured to form a stripline with the signal line of the first conductive layer. At least a portion of the third conductive layer may be connected to a ground supply terminal, the portion of the third conductive layer connected to the ground supply terminal characterized as a first ground plane. At least a portion of the second conductive layer may be connected to the ground supply terminal, the portion of the second conductive layer connected to the ground supply terminal characterized as a second ground plane. Each of the first, second, and third conductive layers may be formed from a copper material. The semiconductor device substrate may further include a first dielectric layer disposed between the first conductive layer and the third conductive layer. The stripline may be formed having the signal line of the first conductive layer located between second conductive layer and the third conductive layer, the first dielectric layer separating the signal line from the third conductive layer. The ETS portion may be characterized as a coreless embedded trace substrate. The semiconductor device substrate may further include a second dielectric layer formed over the third conductive layer, openings in the second dielectric layer configured for connections to a semiconductor die in a flip chip orientation. The ETS portion may further include a second non-conductive layer formed at the second major surface of the ETS portion, openings in the second non-conductive layer configured for connections to a printed circuit board.

In another embodiment, there is provided, a method of manufacturing a semiconductor device substrate, the method includes forming an embedded trace substrate (ETS) portion; and forming a conductive layer over a first major surface of the ETS portion such that a stripline is formed with a signal line of a first embedded conductive layer of the ETS portion. The ETS portion may be formed on a core carrier; and the conductive layer may be formed over the first major surface of the ETS portion after the ETS portion is separated from the core carrier. At least a portion of the conductive layer may be connected to a ground supply terminal, the portion of the conductive layer connected to the ground supply terminal characterized as a ground plane. The ETS portion may be formed including a second embedded conductive layer, the signal line located between the second embedded conductive layer and the conductive layer to form the stripline. The conductive layer and the first embedded conductive layer may each formed from a copper material. The method may further include forming a first dielectric layer on the first major surface of the ETS portion; and patterning and etching the first dielectric layer to expose portions of the first embedded conductive layer before forming the conductive layer. The forming the ETS portion may further include forming a non-conductive layer on a second major surface of the ETS portion; and patterning and etching the non-conductive layer to configure the ETS portion for connections to a printed circuit board.

In yet another embodiment, there is provided, a semiconductor device including an embedded trace substrate (ETS) portion having a first major surface and a second major surface, the ETS portion including a first conductive layer embedded in the ETS portion at the first major surface, a portion of the first conductive layer patterned to form a signal line; a second conductive layer formed over the first major surface of the ETS portion, the second conductive layer configured to form a stripline with the signal line of the first conductive layer; and a dielectric layer formed over the second conductive layer, openings in the dielectric layer configured for connecting exposed portions of the second conductive layer to a semiconductor die in a flip chip orientation. At least a portion of the second conductive layer may be connected to a ground supply terminal, the portion of the second conductive layer connected to the ground supply terminal and characterized as a first ground plane. The stripline may include the signal line of the first conductive layer located between second conductive layer and a third conductive layer, the third conductive layer connected to the ground supply terminal and characterized as a second ground plane. The signal line may be configured for carrying a radio frequency (RF) signal having a frequency in a range of 50 GHz and higher.

By now, it should be appreciated that there has been provided a device substrate configured to form a stripline. The device substrate structure includes a conductive layer formed over a major surface of a coreless embedded trace substrate (ETS). The conductive layer is configured to serve as a ground plane for an embedded signal line at the major surface of the ETS to form the stripline. By forming the device substrate in this manner, a compact footprint is maintained while providing a capability for the stripline formed with the embedded signal line to carry radio frequency (RF) signals having a frequency in a range of 50 GHz and higher, for example.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device substrate comprising:
   an embedded trace substrate (ETS) portion having a first major surface and a second major surface, the ETS portion comprising:
      a first conductive layer embedded in the ETS portion at the first major surface, a portion of the first conductive layer patterned to form a signal line;
      a second conductive layer embedded in the ETS portion;
      a first non-conductive layer disposed between the first conductive layer and the second conductive layer; and
   a first dielectric layer formed directly on the first major surface of the ETS portion; and a third conductive layer formed directly on the first dielectric layer, the third conductive layer configured to form a stripline with the signal line of the first conductive layer.

2. The semiconductor device substrate of claim 1, wherein at least a portion of the third conductive layer is connected to a ground supply terminal, the portion of the third conductive layer connected to the ground supply terminal characterized as a first ground plane.

3. The semiconductor device substrate of claim 2, wherein at least a portion of the second conductive layer is connected to the ground supply terminal, the portion of the second conductive layer connected to the ground supply terminal characterized as a second ground plane.

4. The semiconductor device substrate of claim 1, wherein each of the first, second, and third conductive layers are formed from a copper material.

5. The semiconductor device substrate of claim 1, wherein the stripline is formed having the signal line of the first conductive layer located between second conductive layer and the third conductive layer, the first dielectric layer separating the signal line from the third conductive layer.

6. The semiconductor device substrate of claim 1, wherein the ETS portion is characterized as a coreless embedded trace substrate.

7. The semiconductor device substrate of claim 1, further comprising a second dielectric layer formed over the third conductive layer, openings in the second dielectric layer configured for connections to a semiconductor die in a flip chip orientation.

8. The semiconductor device substrate of claim 1, wherein the ETS portion further comprises a second non-conductive layer formed at the second major surface of the ETS portion, openings in the second non-conductive layer configured for connections to a printed circuit board.

9. A semiconductor device substrate comprising:
an embedded trace substrate (ETS) portion having a first major surface and a second major surface, the ETS portion comprising:
a first conductive layer embedded in the ETS portion at the first major surface, a portion of the first conductive layer patterned to form a signal line;
a second conductive layer embedded in the ETS portion, a portion of the second conductive layer patterned to form a first ground plane;
a first non-conductive layer disposed between the first conductive layer and the second conductive layer; and
a first dielectric layer formed directly on the first major surface of the ETS portion; and
a third conductive layer formed directly on the first dielectric layer, a portion of the third conductive layer patterned to form a second ground plane the third conductive layer configured to form a stripline with the signal line of the first conductive layer and the first ground plane of the second conductive layer of the ETS portion.

10. The semiconductor device substrate of claim 9, wherein the ETS portion is characterized as a coreless embedded trace substrate.

11. The semiconductor device substrate of claim 9, further comprising a second dielectric layer formed over the third conductive layer, openings in the second dielectric layer configured for connections to a semiconductor die in a flip chip orientation.

12. The semiconductor device substrate of claim 9, wherein the ETS portion further comprises a second non-conductive layer formed at the second major surface of the ETS portion, openings in the second non-conductive layer configured for connections to a printed circuit board.

13. The semiconductor device substrate of claim 9, wherein each of the first, second, and third conductive layers are formed from a copper material.

14. A semiconductor device substrate comprising:
an embedded trace substrate (ETS) portion having a first major surface and a second major surface, the ETS portion comprising:
a first conductive layer embedded in the ETS portion at the first major surface, a portion of the first conductive layer patterned to form a signal line;
a second conductive layer embedded in the ETS portion, a portion of the second conductive layer patterned to form a first ground plane;
a first non-conductive layer disposed between the first conductive layer and the second conductive layer; and
a first dielectric layer formed directly on the first major surface of the ETS portion, the first dielectric layer in direct contact with the first conductive layer and the third conductive layer; and
a third conductive layer formed directly on the first dielectric layer, a portion of the third conductive layer patterned to form a second ground plane the third conductive layer configured to form a stripline with the signal line of the first conductive layer and the first ground plane of the second conductive layer of the ETS portion.

15. The semiconductor device substrate of claim 14, wherein the ETS portion is characterized as a coreless embedded trace substrate.

16. The semiconductor device substrate of claim 14, further comprising a second dielectric layer formed over the third conductive layer, openings in the second dielectric layer configured for connections to a semiconductor die in a flip chip orientation.

17. The semiconductor device substrate of claim 14, wherein the ETS portion further comprises a second non-conductive layer formed at the second major surface of the ETS portion, openings in the second non-conductive layer configured for connections to a printed circuit board.

18. The semiconductor device substrate of claim 14, further comprising a plurality of solder balls connected at the second major surface of the ETS portion.

19. The semiconductor device substrate of claim 14, wherein each of the first, second, and third conductive layers are formed from a copper material.

* * * * *